United States Patent [19]
Yokoyama et al.

[11] Patent Number: 5,389,804
[45] Date of Patent: * Feb. 14, 1995

[54] RESONANT-TUNNELING HETEROJUNCTION BIPOLAR TRANSISTOR DEVICE

[75] Inventors: Naoki Yokoyama; Kenichi Imamura, both of Atsugi, Japan

[73] Assignee: Fujitsu Limited, Kanagawa, Japan

[*] Notice: The portion of the term of this patent subsequent to Jun. 25, 2008 has been disclaimed.

[21] Appl. No.: 148,402

[22] Filed: Nov. 8, 1993

Related U.S. Application Data

[60] Continuation of Ser. No. 909,664, Jul. 7, 1992, abandoned, which is a division of Ser. No. 659,162, Feb. 22, 1991, Pat. No. 5,151,618, which is a division of Ser. No. 601,011, Oct. 22, 1990, Pat. No. 5,027,179, which is a continuation of Ser. No. 293,568, Jan. 4, 1989, abandoned, which is a continuation of Ser. No. 937,615, Dec. 3, 1986, abandoned.

[30] Foreign Application Priority Data

Dec. 3, 1985 [JP] Japan ................. 60-270803

[51] Int. Cl.⁶ ............... H01L 29/73; H01L 27/082
[52] U.S. Cl. ................. 257/197; 257/198; 257/15; 257/25
[58] Field of Search ........... 257/14, 15, 25, 197, 257/198

[56] References Cited

U.S. PATENT DOCUMENTS

| | | | |
|---|---|---|---|
| 4,956,681 | 9/1990 | Yokoyama et al. | 257/22 |
| 5,027,179 | 6/1991 | Yokoyama et al. | 257/198 |
| 5,151,618 | 9/1992 | Yokoyama et al. | 257/197 |

FOREIGN PATENT DOCUMENTS

| | | | |
|---|---|---|---|
| 59-211265 | 11/1984 | Japan | 257/197 |
| 59-211266 | 11/1984 | Japan | 257/198 |
| 60-175450 | 9/1985 | Japan | 257/198 |
| 61-216468 | 9/1986 | Japan | 257/197 |
| 61-224365 | 10/1986 | Japan | 287/198 |

OTHER PUBLICATIONS

Japanese Journal of Applied Physics, vol. 24, No. 11, Nov. 1985, "A New Functional Resonant-Tunneling Hot Electron Transistor (RHET)," Yokoyama et al., Tokyo, Japan, pp. L853-L854.

Journal of Applied Physics, vol. 58, No. 3, Aug. 1, 1985, American Institute of Physics, New York, U.S., "Resonant Tunneling Transistor with Quantum Well Base and High-Energy Injection: A New Negative Differential Resistance Device", F. Capasso et al., pp. 1366-1368.

Patent Abstracts of Japan, vol. 7, No. 22 (E-201) [1367], Oct. 4, 1983; and JP-A-58 114 455 (Nippon Denki K.K.), 7-7-83.

International Electron Devices Meeting, Dec. 1981, "Ga, Al/As/GaAs Bipolar Transistors for Digital Integrated Circuits," Asbeck et al., pp. C29-C32.

Primary Examiner—Rolf Hille
Assistant Examiner—Wael M. Fahmy
Attorney, Agent, or Firm—Staas & Halsey

[57] ABSTRACT

A resonant-tunneling heterojunction bipolar transistor (RHBT) device having a superlattice structure and a PN junction. The RHBT includes an emitter layer; a base layer; a collector layer operatively facing the base layer to form a PN junction at the face between the base layer and the collector layer; and a superlattice structure including at least one quantum well defining a sub-band of energy at which carriers resonant-tunnel therethrough, formed at least in the emitter layer and operatively facing to the base layer.

The RHBT has a differential negative resistance characteristics for realizing a variety of logic circuits and includes an electron resonance and a positive hole resonance, for which the generation condition is changeable in response to a mole fraction of material of the emitter layer.

1 Claim, 13 Drawing Sheets

Fig. 2b  $V_{BE} \doteq 2E_x/q$

RESONANT-TUNNELING HETEROJUNCTION BIPOLAR TRANSISTOR DEVICE

This application is a continuation of application Ser. No. 07/909,664, filed Jul. 7, 1992, now abandoned, which is a divisional of application Ser. No. 07/659,162, filed Feb. 22, 1991, now U.S. Pat. No. 5,151,618, which is a divisional of allowed application Ser. No. 07/601,011, filed Oct. 22, 1990, now U.S. Pat. No. 5,027,179, which is a continuation of application Ser. No. 07/293,586, filed Jan. 4, 1989, abandoned, which is a continuation of application Ser. No. 937,615, filed Dec. 3, 1986, abandoned.

BACKGROUND OF THE INVENTION

1. Field of the Invention

The present invention relates to a resonant-tunneling heterojunction bipolar transistor (RHBT), having a superlattice structure between an emitter and a base, through which carriers are resonant-tunneled, and a PN junction between the base and a collector.

2. Description of the Related Arts

The resonant-tunneling phenomena has been long known, and recently, due to advances in semiconductor processing technology, such as molecular beam epitaxy (MBE) and metal organic chemical vapor deposition (MOCVD), practical RHETs have beenrealized (e.g., "A NEW FUNCTIONAL, RESONANT-TUNNELING HOT ELECTRON TRANSISTOR (RHET)", N. Yokoyama, et al, Japanese Journal of Applied Physics, Vol. 24, No. 11, Nov., 1985, pp. L853–L854). The RHET includes a superlattice structure between an n-type emitter and an n-type base and a collector barrier between the n-type base and an n-type collector. The RHET has negative differential resistance characteristics, and accordingly, can be used for ternary logic circuits with a high speed, a compact circuit arrangement, and a large margin, etc., such as, tristable gate circuits or a tristate memory cell. However, the RHET suffers from the disadvantages of a poor current gain and the impossibility of operation under a normal temperature, due to the existence of the collector barrier provided to give the tolerance to the reverse voltage. The above disadvantages will be described later in detail with reference to specific examples.

In addition, another type of resonant-tunneling transistor including a superlattice structure in a base, not between an emitter and the base as set forth above, is known (e.g., "Resonant tunneling transistor with quantum well base and high-energy injection: A new negative differential resistance device:, F. Capasso, et al, J. Appl. Phys. 53(3), August 1985, PP. 1366–1368). However, in this resonant-tunneling transistor, electrons from the emitter must be ballistically launched at the base and pass into a narrow sub-band in the superlattice structure, and consequently, this transistor is also subjected to a low current gain.

SUMMARY OF THE INVENTION

An object of the present invention is to provide a resonant-tunneling transistor having an improved current gain.

Another object of the present invention is to provide a resonant-tunneling transistor stably operable in a normal ambient temperature.

Still another object of the present invention is to provide a resonant-tunneling transistor having suitable negative differential resistance characteristics and applicable to the forming of a variety of circuits.

Yet another object of the present invention is to provide a resonant-tunneling transistor providing new functions by adjusting the composition of the materials therefor.

According to the present invention, there is provided a resonant-tunneling heterojunction bipolar transistor device including: an emitter layer; a base layer; a collector layer having a operatively facing the base layer to form a PN junction at the face between the base layer and the collector layer; and a superlattice structure including at least one quantum well defining a sub-band of energy at which carriers resonant-tunnel therethrough, formed at least in the emitter layer and operatively facing the base layer.

The superlattice structure may be formed between the emitter layer and the base layer.

According to the present invention, an n-p-n transistor device can be formed, or conversely, a p-n-p transistor device can be formed. The superlattice structure and the PN junction between the base layer and the collector layer are provided in both of these transistor devices.

The resonance may include a resonance of electrons and a resonance of positive holes, and the generation condition of the electron resonance and the positive hole resonance is changed in response to a mole fraction of the material in the emitter layer.

The resonant-tunneling heterojunction bipolar transistor device may have a base negative differential resistance (NDR) characteristic with at least one resonant point in a relationship between a current flowing in and said base layer and a voltage between the base and emitter layers, and having at least two stable base current values at both sides of the resonant point on the characteristic, defined by the changeable baseemitter voltage.

The NDR can be used for a variety of logic circuits. A logic circuit may include the resonant tunneling heterojunction bipolar transistor device; a current source ohmic-connected to the base layer of the transistor device and supplying a constant current to the base layer; a load circuit ohmic-connected to the collector layer of the transistor device; and an output circuit operatively connected to a commonly connected point of the load circuit and the collector layer, for outputting a voltage defined by a change of a current flowing through the collector layer, which voltage is varied in response to the two stable base current values.

The resonant-tunneling heterojunction bipolar transistor device may also have a collector differential negative-resistance characteristic with at least one resonant point in a relationship between a current flowing in and the collector layer and a voltage between the base and emitter layers, and having at least two stable collector current values at both sides of the resonant point on the characteristic, defined by the changeable base emitter voltage. This NDR can be used for a variety of logic circuits.

The logic circuit may include the resonant-tunneling heterojunction bipolar transistor device; at least two input resistors operatively connected to the base layer of the transistor device; and an output resistor operatively connected to the collector layer of the transistor device.

BRIEF DESCRIPTION OF THE DRAWINGS

Other objects and features of the present invention will be described below in detail with reference to the accompanying drawings, in which:

FIGS. 2a to 2c are graphs illustrating an energy state of the RHET shown in FIG. 1a;

FIGS. 7a, 7b, 8a; and 8b are graphs illustrating energy states of the RHBT shown in FIG. 5;

DESCRIPTION OF THE PREFERRED EMBODIMENTS

Before describing the preferred embodiments of the present invention, a description will be given of a resonant-tunneling hot electron transistor (RHET).

Figure 1A:
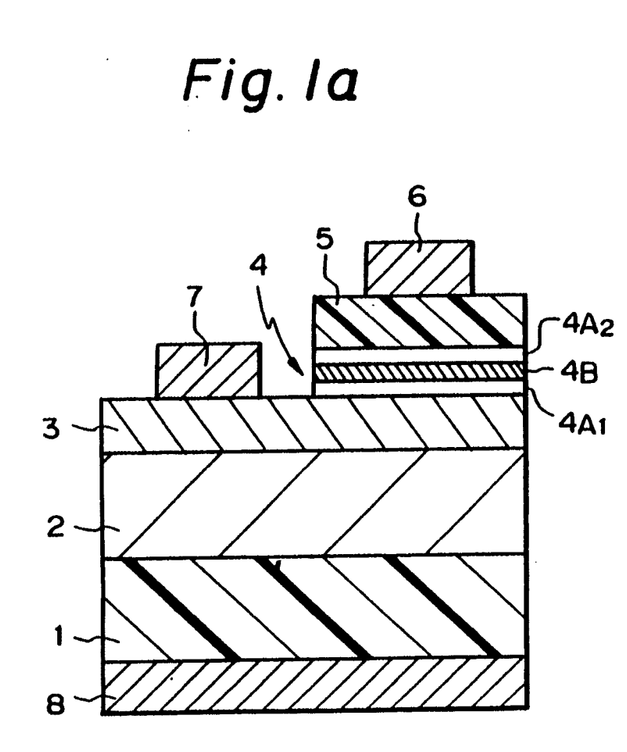
FIGS. 1a and 1b are views representing a structure and an energy state of a resonant-tunneling hot electron transistor (RHET)
Figure 1B:
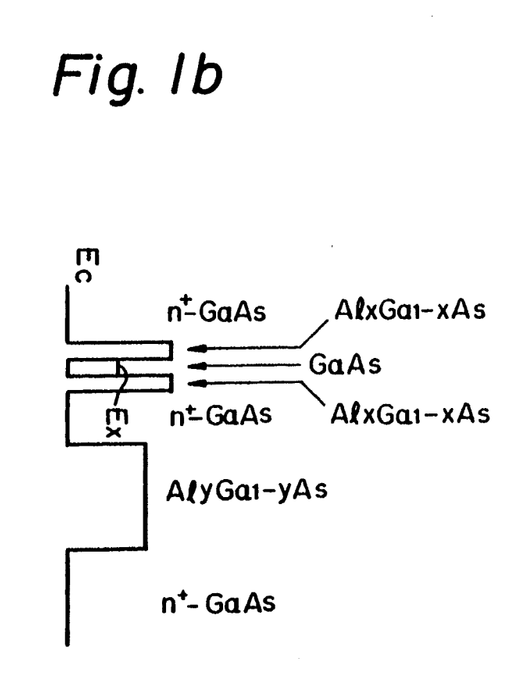

FIG. 1a is a sectional view of a semifinished RHET device, and FIG. 1b is a graph of an energy band of the RHET device in FIG. 1a. In FIG. 1a, the resonant-tunneling transistor device consists of a collector electrode 8, an n+-type GaAs collector layer 1, formed on the collector electrode 8, a non-doped impurity $Al_yGa_{1-y}As$ (e.g. y=0.3) collector side potential barrier layer 2 on the collector layer 1, an n+-type GaAs base layer 3, on the potential barrier layer 2, a superlattice layer 4, an n+-type GaAs emitter layer 5, an emitter electrode 6, and a base electrode 7. The superlattice layer 4 consists of an $Al_xGa_{1-x}As$ barrier layer $4A_1$, a non-doped impurity GaAs quantum well layer 4B, and an $Al_xGa_{1-x}As$ barrier layer $4A_2$. The superlattice layer 4 functions as an emitter side potential barrier. In this specification, the superlattice is defined such that at least one quantum well is provided therein. In FIG. 1a, a plurality of quantum wells may be formed.

In FIG. 1b, reference $E_C$ represents a bottom of a conduction-energy band, and $E_X$ an energy level of a sub-band at the quantum well.

Figures 2A, 2B, 2C:
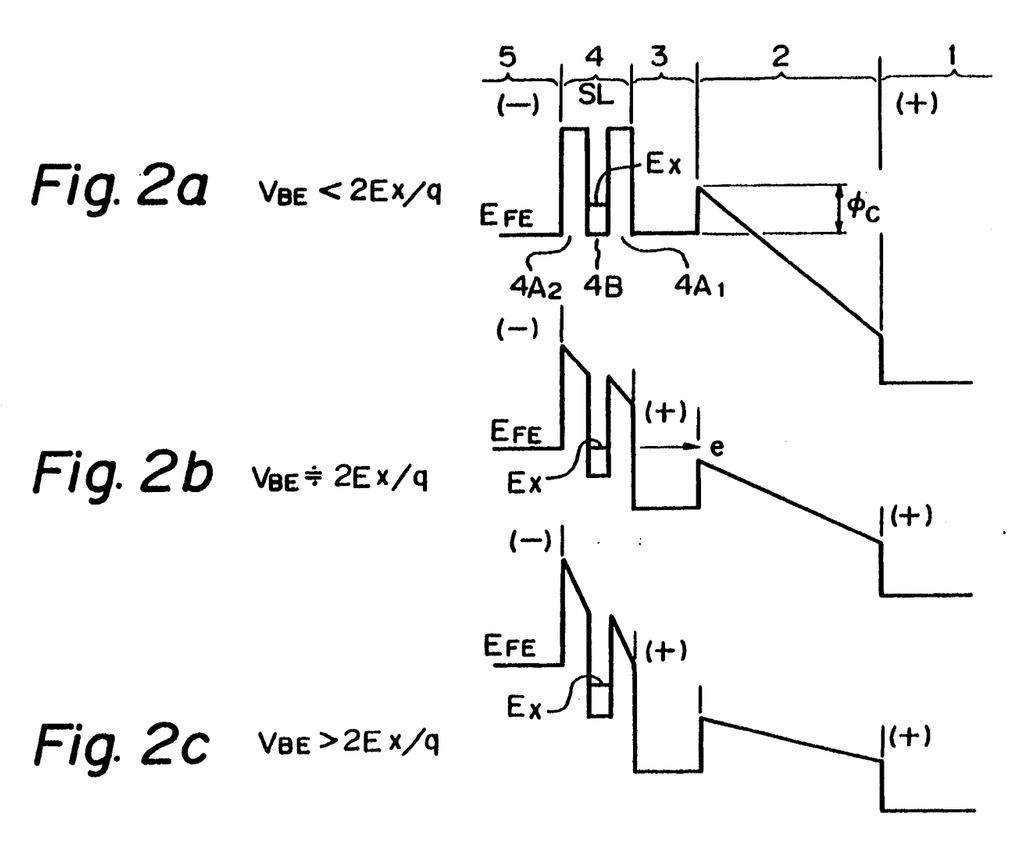

Reference to FIGS. 2a to 2c, the principle of the operation of the resonant-tunneling transistor device will be described.

FIG. 2a is a graph of an energy band of the RHET device when a voltage $V_{BE}$ between the base layer 3 and the emitter layer 5 is lower than $2 \cdot E_X/q$, wherein q represents charge of carriers, or is too low, for example, approximately zero volt. In FIG. 2a, although a voltage $V_{CE}$ exists between the collector layer 1 and the collector layer 3, electrons at the emitter layer 5 cannot reach the base layer 3 by tunneling through the superlattice layer 4, since the base emitter voltage $V_{BE}$ is almost zero, and thus a level of an energy $E_{FE}$, namely a quasi-Fermi level, of the emitter layer 5 differs from the energy level $E_X$ at the sub-band. Accordingly, a current does not flow between the emitter layer 5 and the collector layer 1. Reference $\phi_C$ represents a conduction-band discontinuity.

FIG. 2b is a graph of an energy band of the RHET device when the base.emitter voltage $V_{BE}$ is approximately equal to $2 \cdot E_X/q$. In FIG. 2b, the energy level $E_{FE}$ at the emitter layer 5 is substantially equal to the energy level $E_X$ of the sub-band at the quantum well layer 4B. As a result, due to a resonant-tunneling effect, electrons at the emitter layer 5 are passed through the superlattice layer 4 and injected in the base layer 3. The potential energy of the injected electrons, for example, 0.3 eV, is converted to a kinetic energy, bringing the electrons to a so-called "hot" state. The hot electrons are ballistically passed through the base layer 3 and reach the collector layer 1. As a result, a current flows between the emitter layer 5 and the collector layer 1.

FIG. 2c is a graph of an energy band of the RHET device when the base.emitter voltage $V_{BE}$ is higher than $2 \cdot E_X/q$. In FIG. 2c, the energy level $E_{FE}$ at the emitter layer 5 is higher than the energy level $E_X$ of the sub-band at the quantum well layer 4B. The resonanttunneling effect does not occur, and the electrons introduced from the emitter layer 5 to the base layer 3 do not exist. Consequently, the current flowing into the RHET device is reduced. On the other hand, by decreasing the barrier height of the barrier layer $4A_1$ adjacent to the base layer 3 to a suitable value, the electrons may be directly tunneled through the barrier layer $4A_2$ adjacent to the emitter layer 5. As a result, a certain amount of collector current may flow.

Figure 3:
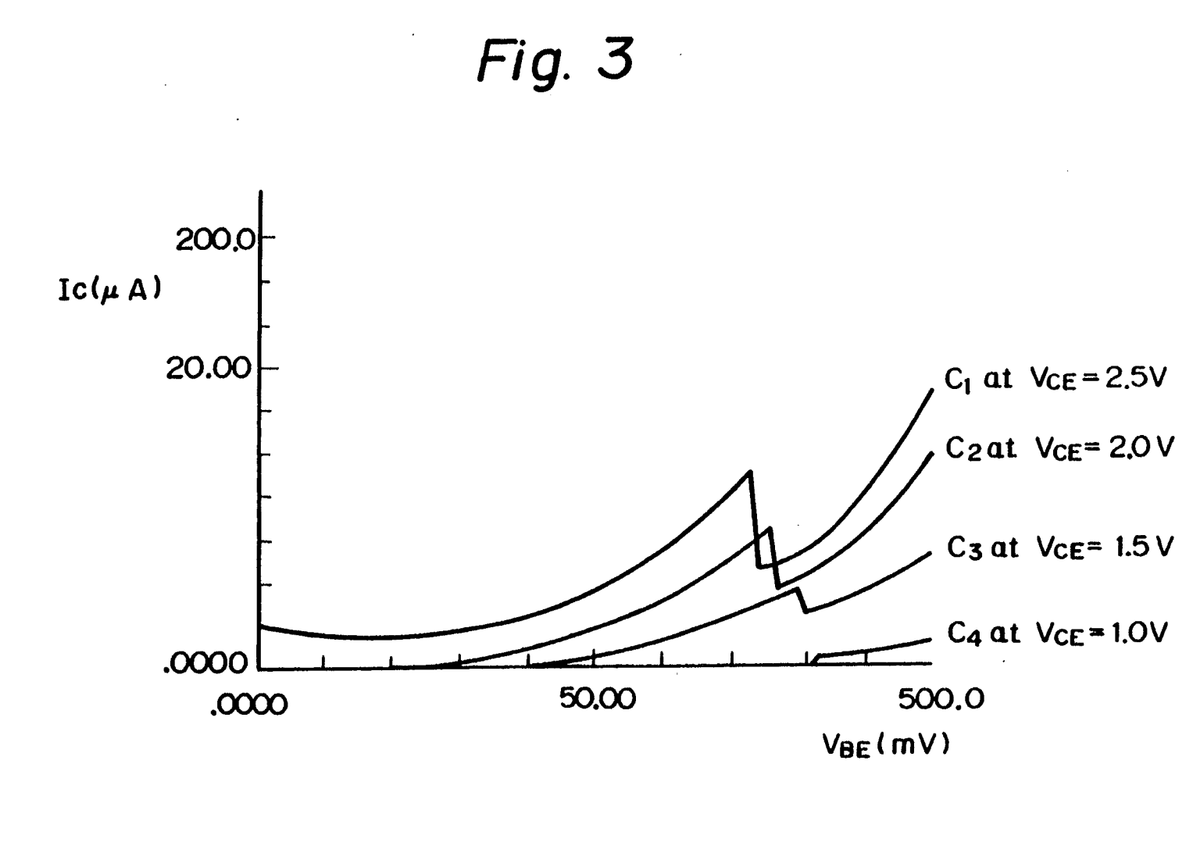
FIG. 3 is a graph of the negative differential resistance characteristics of the RHET.

FIG. 3 is a graph representing the characteristics of the RHET device set forth above. In FIG. 3, the abscissa indicates the base.emitter voltage $V_{BE}$ and the ordinate indicates the collector current $I_C$. Curves $C_1$ to $C_4$ represent the characteristics when the collector.-emitter voltage $V_{CE}$ are respectively 2.5 V, 2.0 V, 1.5 V, and 1.0 V.

The curves also indicate n-shaped differential negative-resistance (NDR) characteristics. By using this feature, a variety of circuits, such as ternary logic circuits, can be realized.

The above RHET device is composed of the heterojunctioned n-type emitter, n-type base and n-type collector, and therefore, the collector potential barrier must be provided between the base and the collector to give the tolerance to the voltage, i.e. the insulation. Because of the collector potential barrier, the RHET device suffers from troublesome defects. Namely, a low current gain existing because most of the electrons, which are emitted from the emitter layer to the superlattice layer, resonant-tunneled thereat, and injected to the base in a hot state, are affected by a phonon scattering, e.g., an optical phonon scattering, an intervalley scattering, in the base layer, and accordingly, they can not go over the collector potential barrier. On the other hand, to provide sufficient isolation, the collector potential barrier must be thick and high. In a normal ambient (room) temperature, the height of the collector porential barrier is low. In addition, when the collector potential barrier is low, considerable thermionic emission may occur, and thus the RHET device may not perform as a normal transistor. If the collector potential barrier is high, electrons can not always reach the collector, resulting in a low current gain. In order to overcome this defect, an energy of the electrons must be raised, but this is subject to an intervalley scattering, also resulting in a low current gain. As a result, the RHET device can not be substantially operated in a normal ambient temperature and must be super-cooled by, for example, liquid nitrogen.

Now, preferred embodiments of the present invention will be described.

Figure 4:
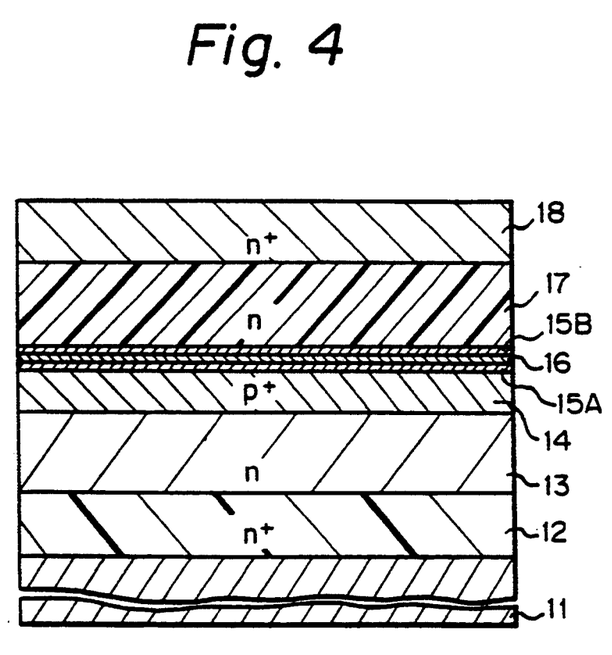
FIG. 4 is a sectional view of a semiconductor wafer of a resonant-tunneling heterojunction bipolar transistor (RHBT) of an embodiment of the present invention.
Figure 5:
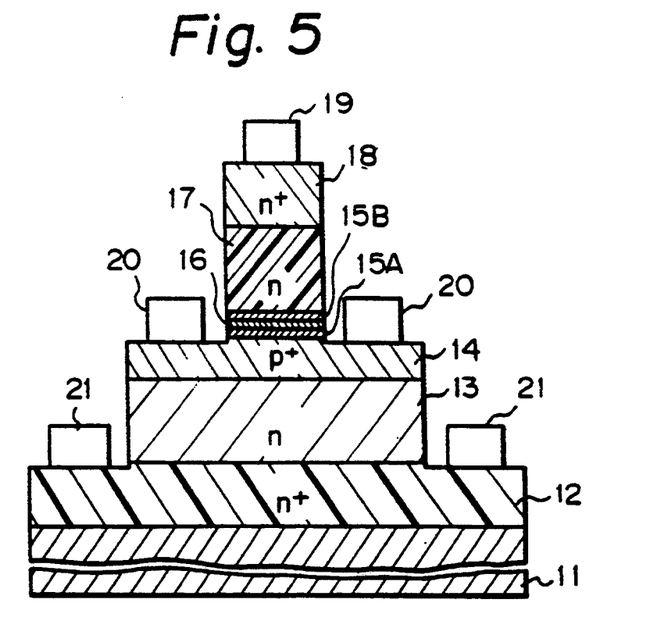
FIG. 5 is a sectional view of a semifinished RHBT device of FIG. 4.
Figure 6:
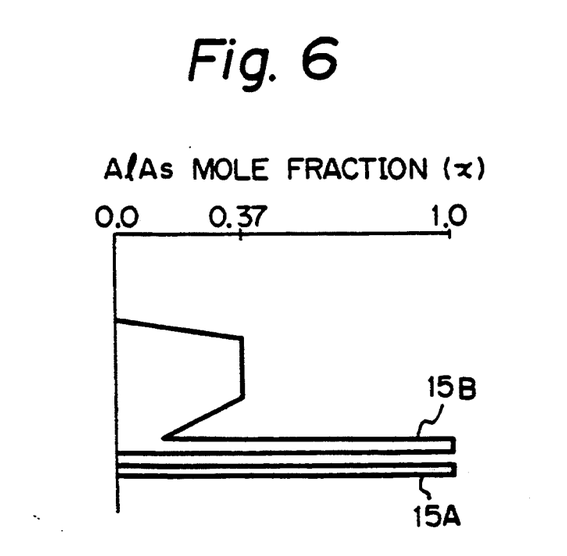
FIG. 6 is a graph illustrating a profile of the AlAs composition of the RHBT device shown in FIG. 5.

FIG. 4 is a sectional view of a semiconductor wafer of a resonant-tunneling heterojunction bipolar transistor (RHBT) of an embodiment of the present invention; FIG. 5 is a sectional view of a semifinished RHBT device of FIG. 4; and FIG. 6 is a graph illustrating a profile of the AlAs composition of the RHBT device shown in FIG. 5. In FIGS. 4 and 5, the RHBT consists of a substrate 11 made of GaAs and having a semiisolation property, an n+-type collector contact layer 12 of GaAs, an n-type collector layer 13 of GaAs, a p+-type base layer 14 of GaAs, a barrier layer 15A of $Al_yGa_{1-y}As$, a quantum well layer 16 of GaAs, a barrier layer 15B of $Al_yGa_{1-y}As$, an n-type emitter layer 17 of $Al_xGa_{1-x}As$, and an n+-type emitter contact layer 18 of GaAs. The RHBT is provided with an emitter electrode 19 ohmic-connected to the emitter layer 18, base electrodes 20 ohmic-connected to the base layer 14, and collector electrodes 21 ohmic-connected to the collector layer 13.

The parameter of the above elements are as follows:
(1) Collector contact layer 12
thickness: 200 nm (2000 Å)
impurity density: $5 \times 10^{24}/m^3$ ($5 \times 10^{18}/cm^3$)
(2) Collector layer 13
thickness: 300 nm (3000 Å)
impurity density: $1 \times 10^{23}/m^3$ ($1 \times 10^{17}/cm^3$)
(3) base layer 14
thickness: 100 nm (1000 Å)
impurity density: $5 \times 10^{24}/m^3$ ($5 \times 10^{18}/cm^3$)
(4) barrier layers 15A and 15B
thickness : 5 nm (50 Å)
y: 0.3
(5) quantum well layer 16
thickness: 5 nm (50 Å)
(6) emitter layer 17
thickness: 300 nm (3000 Å)
impurity density: $1 \times 10^{23}/m^3$ ($1 \times 10^{17}/cm^3$)
x: 0.37
(7) emitter contact layer 18
thickness: 200 to 300 nm (2000 to 3000 Å)
impurity density: $6 \times 10^{24}/m^3$ ($6 \times 10^{18}/cm^3$)
(8) emitter electrode 19
a.
material: Au.Ge
thickness: 30 nm (300 Å)
b.
material: Au
thickness: 300 nm (3000 Å)
(9) base electrode 20
a.
material: Cr
thickness: 30 nm (300 Å)
b.
material: Au
thickness: 300 nm (3000 Å)
(10) Collector electrode 21
a.
material: Au.Ge
thickness: 30 nm (300 Å)
b.
material: Au
thickness: 300 nm (3000 Å)

The AlAs mole fraction x of the emitter layer 17 is 0.37, and the AlAs mole fraction near the emitter layer side 17 of the quantum well layer 16 is graded from 0.37 to 0.14. Accordingly, the energy of the conduction band edge of the emitter side 17 of the quantum well layer 16 is substantially equal to the resonant energy level. This superlattice structure was grown successively on the n+-type AaAs substrate at 580° C. by MBE.

Figure 7:
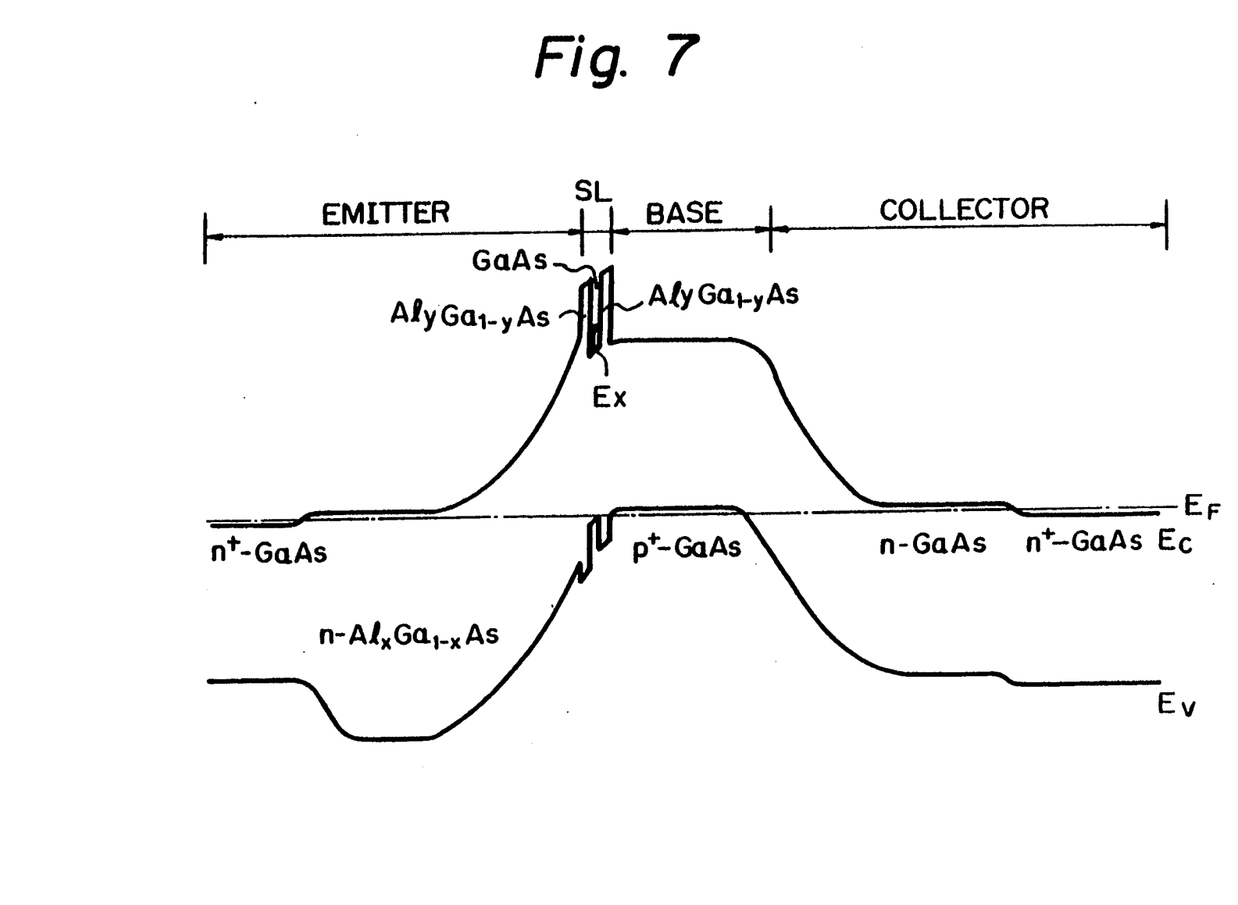
Figure 8:
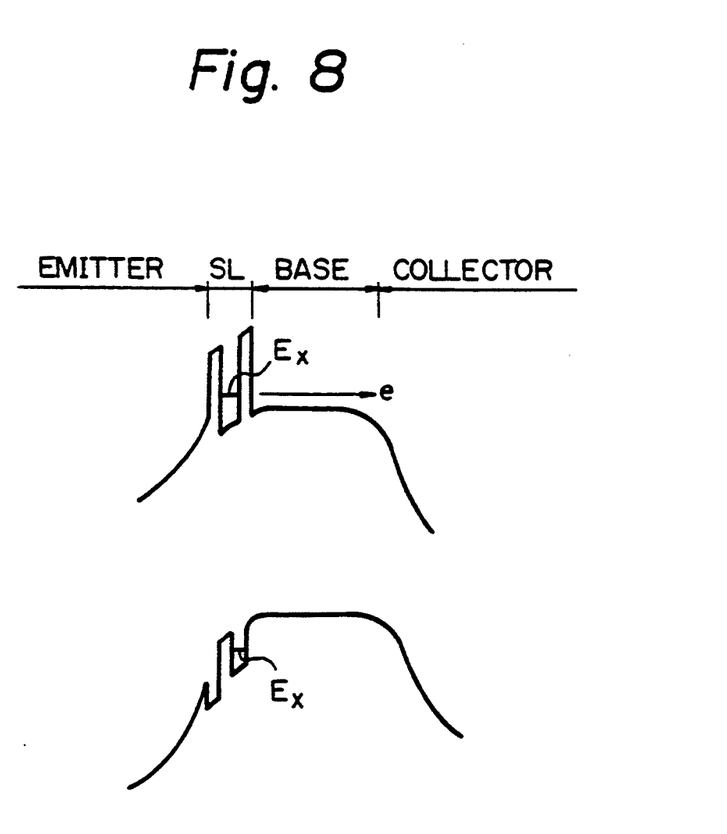

FIG. 7 is a graph representing the energy band of the RHBT when the bias voltage $V_{BE}$ is lower than $2 \cdot E_X/q$ or substantially zero. FIG. 8 is an enlarged graph representing an energy band of the RHBT when a bias voltage $V_{BE}$ between the emitter layer 17 and the base layer 14 is approximately equal to or higher than $2 \cdot E_X/q$ (where, $E_X$ represents an energy level of a sub-band at the quantum well layer 16, and q charges). In the drawings, $E_{FE}$ represents a quasi Fermi level; $E_X$ a sub-band energy; $E_C$ a bottom of a conduction energy band; and, $E_V$ an upper end of a valence (or filled) band.

As is apparent from FIGS. 4 and 5, the RHBT includes the superlattice structure providing the resonant-tunneling effect between the base layer 14 and the emitter layer, and a PN junction formed by the p-type base layer 14 and the n-type collector layer 13. On the other hand, there is no potential barrier between the base and the collector, as shown in FIGS. 2a to 2c. The PN junction between the base layer 14 and the collector layer 13 has sufficient isolation for carriers, and thus functions as an isolation layer instead of the potential barrier in the resonant-hot electron transistor device.

When the bias voltage $V_{BE}$ is supplied, electrons in the emitter layer 17 are resonant-tunneled in the superlattice structure at the sub-band energy $E_X$, and injected into the base layer 14. Since there is no potential barrier, the injected electrons can almost reach the collector layer 13. As a result, high current gains can be realized.

In addition, the RHBT has the small leakage current characteristics of the base-collector PN junction thereof, enabling the RHBT to be used at room temperature because excited thermionic electrons do not surmount the base-collector potential barrier, and thus a thermionic current is small.

Figure 9:
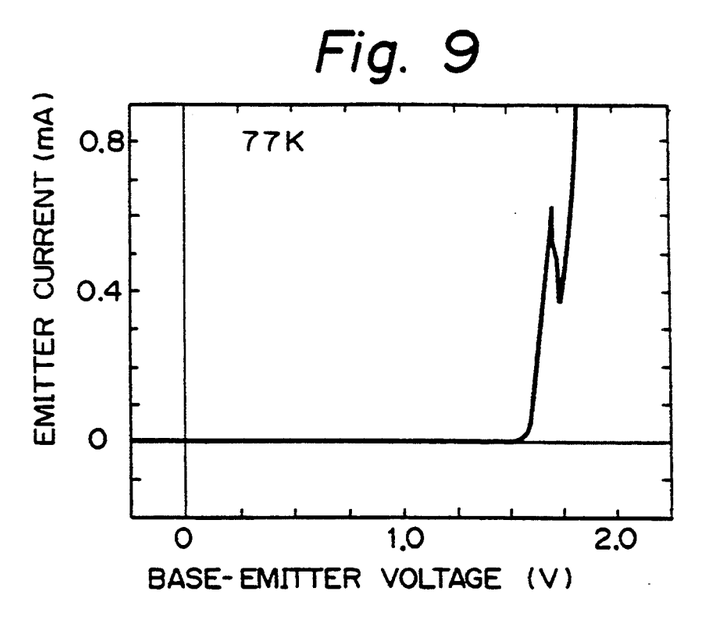
FIGS. 9 to 11 are graphs illustrating the characteristics of the RHBT shown in FIG. 5.
Figure 10:
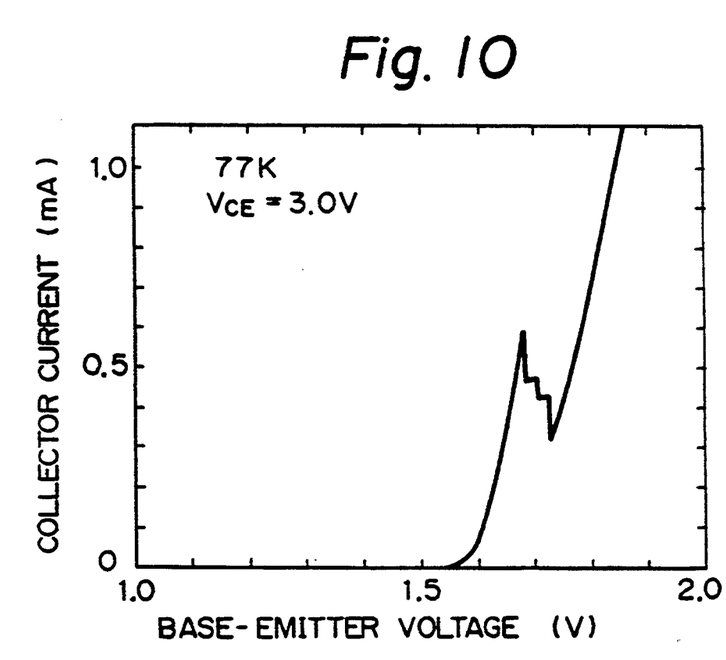
Figure 11:
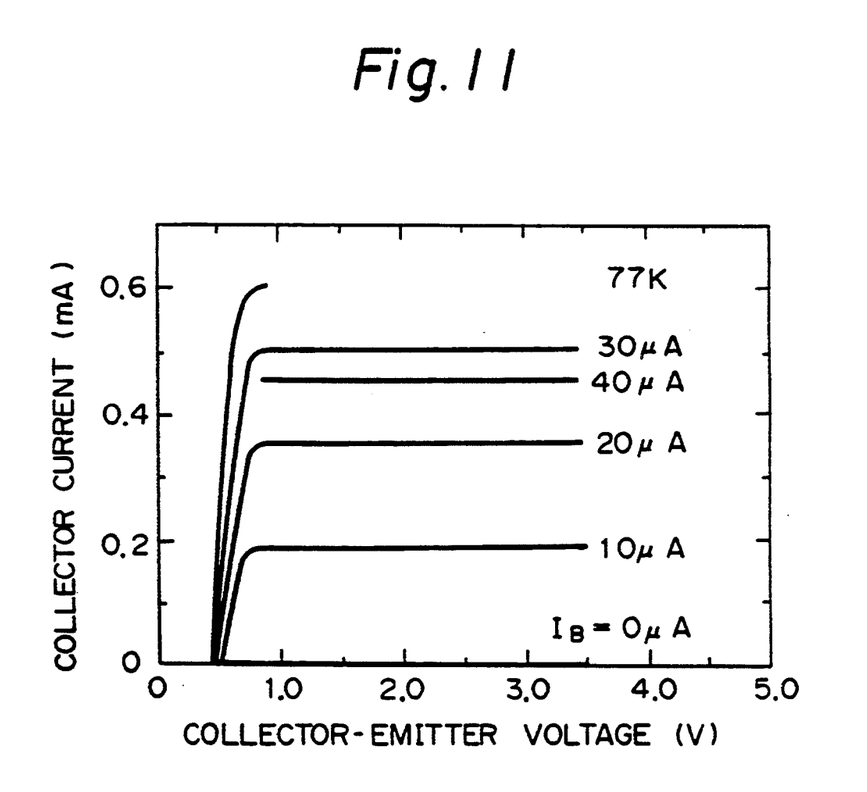

The characteristics of the RHBT in FIG. 5 are shown in FIGS. 9 to 11. FIG. 9 is a graph representing the base-emitter I-V characteristics measured at 77° K. with the collector open. A negative differential resistance (NDR) region exists at approximately the base-emitter voltage $V_{BE}$ of 1.7 V. FIG. 10 is a graph representing the characteristics of the collector current and the base-emitter voltage $V_{BE}$. The collector current as a function of the base-emitter voltage $V_{BE}$ exhibits a peak corresponding to the resonant-tunneling of the electrons. The peak-to-valley ratio is approximately 1.8 at 77° K., and 2.4 at 5° K. FIG. 11 is a graph illustrating the collector current and the collector and emitter voltage ($I_C - V_{CE}$) characteristics at 77° K., in a common-emitter configuration, with the base current $I_B$ as a parameter. Note that there is an abrupt decrease in the collector current when the base current $I_B$ increases from 30 µA to 40 µA. This indicates that the RHBT has a negative current gain. The current gain $h_{fe}$ is typically observed to be 15 in the regular region, i.e. the positive current gain region, and the maximum current gain is 20. These values are far higher than those of the RHET.

The NDR characteristic of the RHBT can be applied to form a variety of circuits, in the same way as the RHET.

In addition, the electron resonance and the hole resonance can be adjusted in response to the AlAs mole fraction x of the emitter layers 17 of $Al_xGa_{1-x}As$, as shown in FIG. 6, by changing the bias voltage. Aluminium (Al) contributes to the generation of the electric field in the emitter layer, and accordingly, the AlAs mole fraction x varies the height of the emitter layers. Examples of this feature are given as follows:

(a) When the fraction x of $Al_xGa_{1-x}As$ is 0.0, i.e. GaAs, the hole resonance and the electron resonance are simultaneously made to rise.

This type of the RHBT can be used for a light emitting element.

Figure 12:
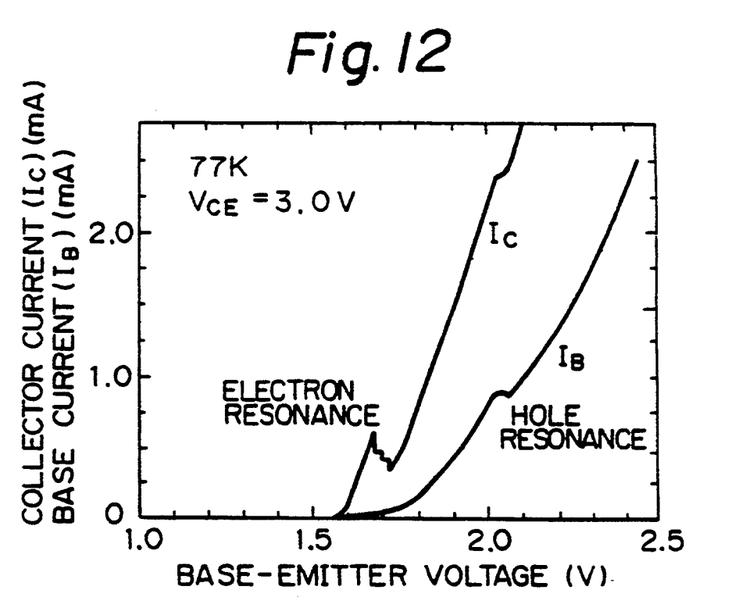
FIG. 12 is a graph indicating the resonance characteristics.

(b) When the fraction x is 0.14, i.e. $Al_{0.14}Ga_{0.86}As$, the electron resonance rises, and thereafter, the hole resonance rises, in response to the increase in the bias voltage. As shown in FIG. 12, the electron resonance is raised by the resonant-tunneling of electrons at a low sub-band energy. On the other hand, the hole resonance is raised by the resonant-tunneling of holes at a high sub-band energy. At the electron current resonance, the collector current resonance occurs, and at the hole resonance, the base current resonance occurs. The base current resonance has n-shaped NDR characteristics.

(c) When the fraction x is 0.2, i.e., $Al_{0.2}Ga_{0.8}As$, the hole resonance rises, and thereafter, the electron resonance rises. This phenomenon is the reverse of that of the above case (b). At the hole resonance, the base current resonance occurs, and at the electron resonance, the collector current resonance occurs.

The collector current resonance has the n-shaped negative differential resistance characteristics as set forth above.

An example of the application of the RHBT of a type (b) descirbed above and having a base current n-shaped NDR characteristics will be described below.

Figure 13:
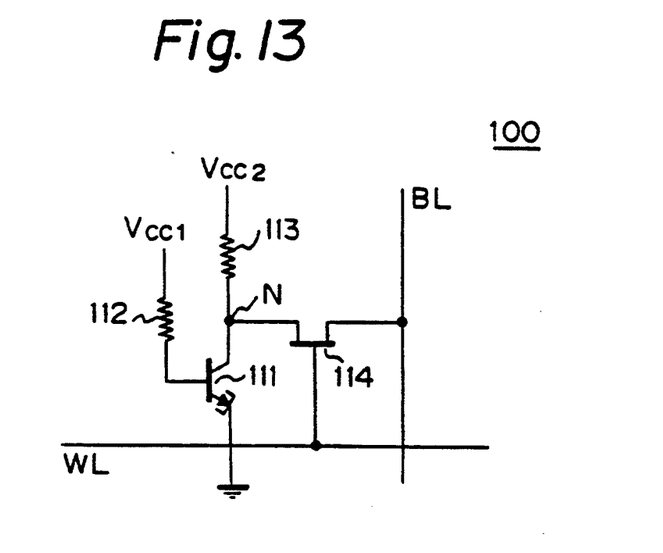
FIG. 13 is a circuit diagram of a memory cell using the RHBT of an embodiment of the present invention.
Figure 14:
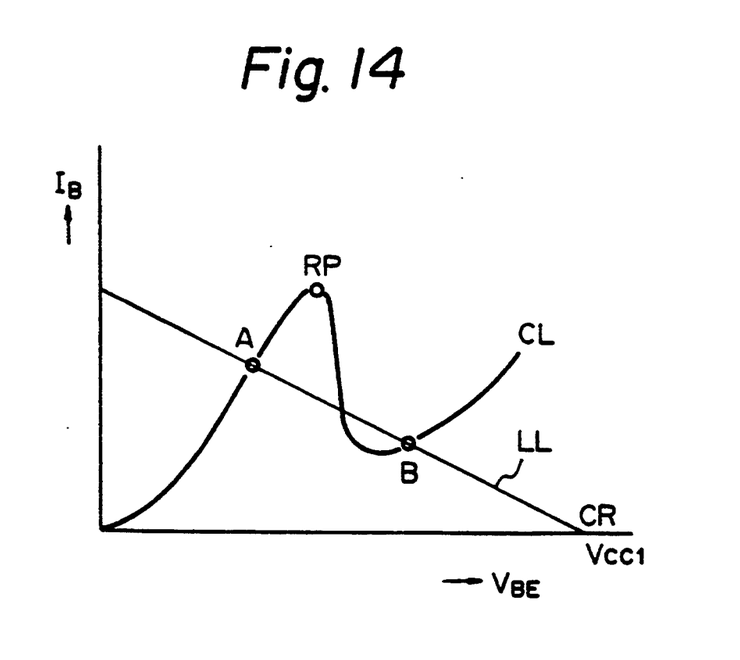
FIG. 14 is a curve representing the operational characteristics of the memory cell shown in FIG. 13.

FIG. 13 is a circuit diagram of a semiconductor memory cell 100. The memory cell 100 includes a RHBT 111, a current source resistor 112, a load resistor 113, and a transfer transistor 114 having a gate connected to a word line WL and a source connected to a bit line BL. A base of the RHBT 111 is supplied with a positive voltage $V_{CC1}$ through the resistor 112. The resistor 112 functions as a constant current source provided between the base and the emitter of the RHBT 111. A collector of the RHBT 111 is supplied with a positive voltage $V_{CC2}$ through the resistor 113. The resistor 113 acts as a load, i.e., a dropping resistor. FIG. 14 is a view illustrating the characteristics of the memory cell shown in FIG. 13. In FIG. 14, the abscissa represents the base.emitter voltage $V_{BE}$, and the ordinate represents the base current $I_B$. A curve CL indicates the NDR characteristic of the RHBT 111. The characteristic curve CL has an n-shaped negative-differential characteristic of the base.emitter voltage $V_{BE}$ and the base current $I_B$. A first summit point RP in the curve CL represents a resonant-tunneling point. A line LL in the figure indicates a load line defined by the voltage $V_{CC1}$ supplied to the base of the RHBT 111 and a resistance value of the load resistor 113. The resistance value defines a gradient of the load line LL. The voltage $V_{CC1}$ defines an intersection CR intersecting the load line LL and the abscissa. The load line LL must be determined such that the line LL intersects a first positive slope line of the characteristic curve CL at a point A and a second positive slope line at a point B, to define bistable states of the memory cell at the points A and B. The graph in FIG. 7 represents an energy state at the point A in FIG. 14. The sub-band energy level $E_X$ at the quantum well layer 16 in FIG. 8 is higher than the energy level $E_{FE}$ at the emitter layer 17. The graph in FIG. 8 represents an energy state at the point B in FIG. 14. In both states at points A and B, a certain amount of electrons can reach the base layer 3 and the collector layer 1 from the emitter layer 5, and consequently, currents corresponding to the above electrons can flow therein. Here, the resistance value $R_B$ of the current resistor 12 is 1.5 KΩ, the resistance value $R_L$ of the load resistor 12 is 10 KΩ, the voltage $V_{CC1}$ of the constant current source is 1 V, and the voltage $V_{CC2}$ of the load is 1 V.

Figure 15A:
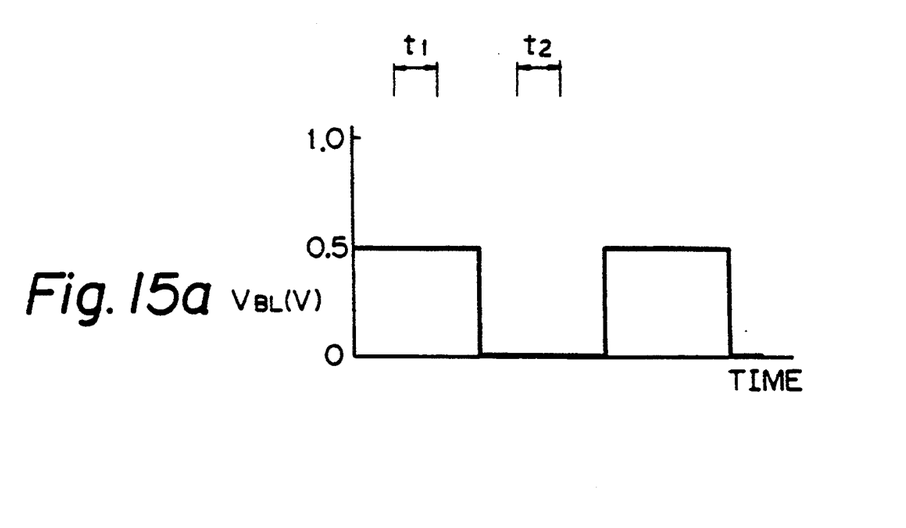
FIGS. 15a to 15c are timing charts representing the operation of the momory cell shown in FIG. 13.
Figure 15B:
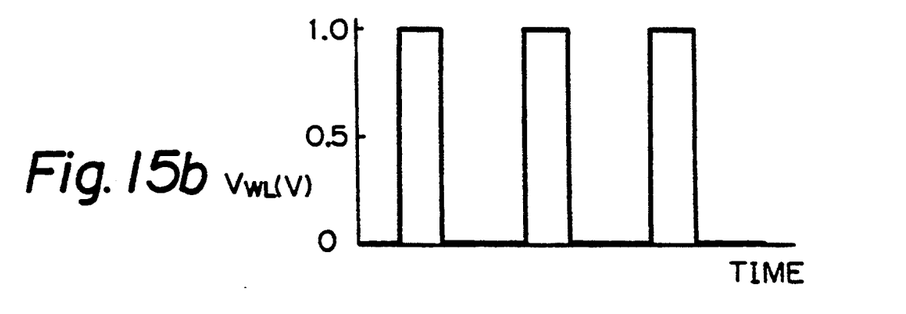
Figure 15C:
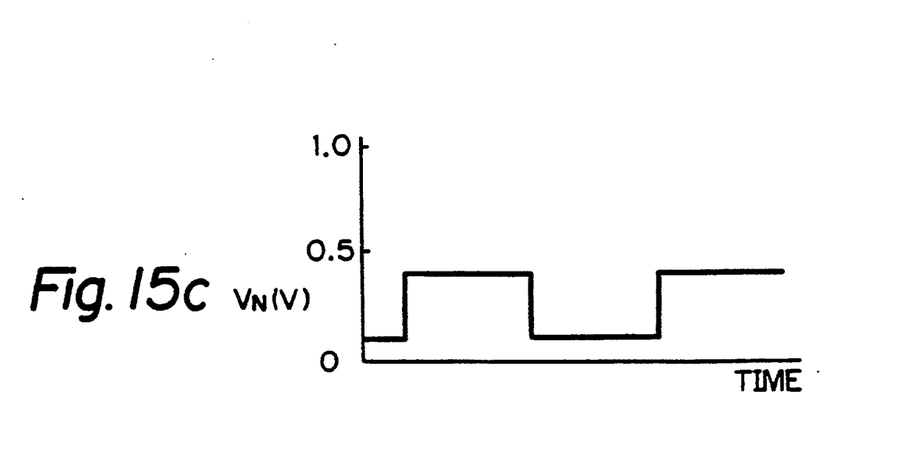

The operation of the semiconductor memory cell in FIG. 13 will be described with reference to FIGS. 15a, 15b, and 15c. In the drawings, the abscissas indicate an elapse of time. FIG. 15a is a graph of the voltage change $V_{BL}$ of the bit line BL; FIG. 15b is a graph of the voltage change $B_{WL}$ of the word line WL; and, FIG. 15c is a graph of the voltage change $V_N$ at a node N forming a common connection point for the collector of the RHBT 111, the load resistor 113, and a collector of the transfer transistor 114. As set forth above, the resistor 112 functions as the current source, and thus the current source 112 outputs a constant voltage between the base and the emitter of the RHBT 111. Conversely, a voltage $V_{CE}$ between the collector and the emitter of the RHBT 111 may be varied by supplying a varying voltage to the bit line BL at each time of word line WL selections, as shown in FIGS. 15a and 15b. By varying the potential at the collector of the RHBT 111, the base current $I_B$ of the RHBT 111 flows in or out, resulting in a change in the base voltage. Accordingly, the bistable state may be controlled and used for a memory function. Referring back to FIGS. 15a to 15c, during a time $t_1$, the bit line BL is supplied with the voltage $V_{BL}$ of 0.5 V and the word line WL is supplied with the voltage $V_{WL}$ of 1.0 V. The transfer transistor 114 is turned ON by a high level of the voltage $V_{WL}$, and the voltage $V_N$ at the node N is brought to approximately 0.4 V. During a time $t_2$, the bit line BL is supplied with the voltage $V_{BL}$ of zero volt and the word line WL is supplied with the voltage $V_{WL}$ of 1.0 V, and the transfer transistor 114 is turned ON by the high level of the voltage $V_{WL}$. Since, however, the voltage $V_{BL}$ of the bit line BL is zero volt, the voltage $V_N$ at the node N is approximately 0.1 V.

The above memory cell includes an RHBT latch circuit. Accordingly, it should be understood that a latch circuit using an RHBT also can be easily realized according to the present invention.

In the RHBT, positive holes can be resonant-tunneled, and this resonant-tunneling of the holes causes the negative differential resistance in a base current.

Another example of the application of the RHBT of the type (c) described above and having collector current n-shaped NDR characteristics will be described below.

Figures 16, 17:
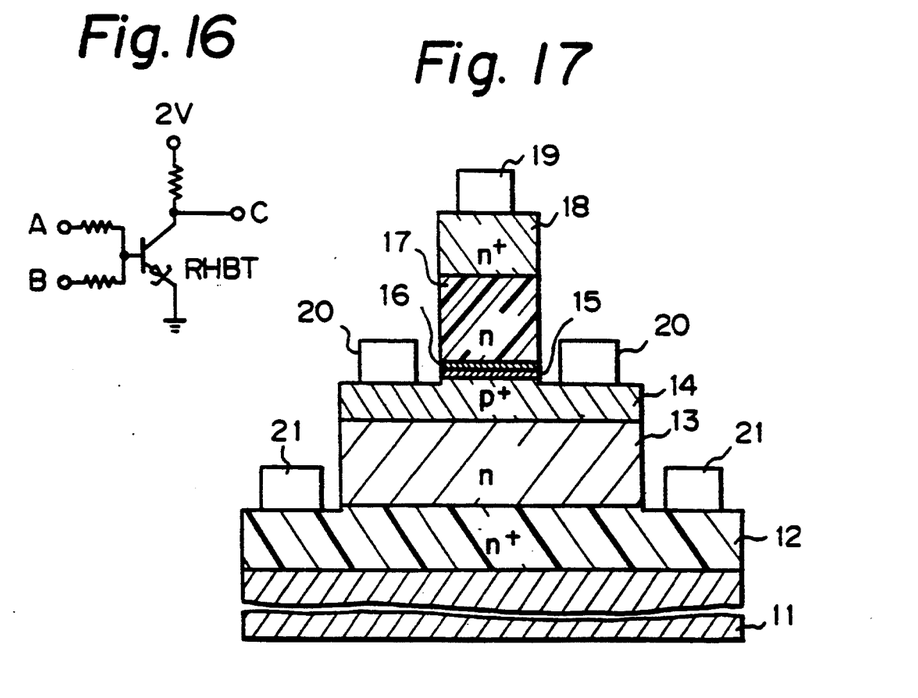
FIG. 16 is a circuit deagram of an ExclusiveNOR logic circuit including the RHBT hown in FIG. 5.
FIG. 17 is a sectional view of another semifinished RHBT of another embodiment in accordance with the present invention.

FIG. 16 is a ciucuit diagram of an Exclusive-NOR logic circuit having the RHBT device and three resistors. The resistances are 1 k ohm for the load and 50 ohms for the wired-or resistor. DC offset voltages of 0.35 V are applied to the input A and B. Note that output C is high only for A=B, indicating that the ciucuit has an Exclusive-NOR logic function. The small logic swing of 50 mV is due to increased valley current and increased peak voltage. The Exclusive-NOR function is widely used to build adders and parity detectors/generators. Considering that several switching FETs or bipolar transistors are required to build Exclusive-OR logic, the RHBT shows great promise for use in very high-speed, high-density integrated ciucuits.

Figure 18:
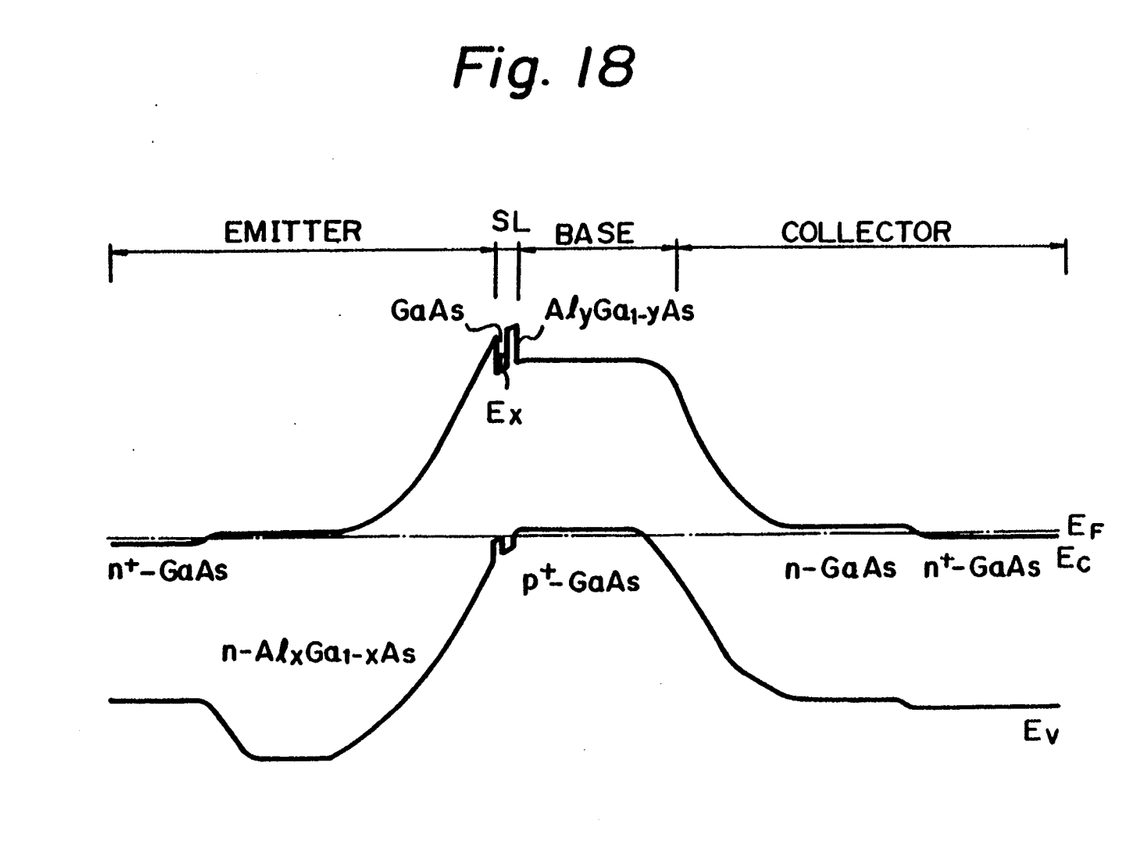
FIG. 18 is a graph illustrating an energy state of the RHBT shown in FIG. 17.

Referring again to FIGS. 4 and 5, other materials can be applied to the respective layers, and some examples of these materials are shown as follows:

(a) base layer 14
(InGa)As, (InAlGa)As
(b) emitter layer 17
(InAlGa)As, (InGa)As
(c) collector layer 13
(InGa)As
(d) barrier layers 15A and 15B
AlAs, (InAl)As, InP
(e) substrate 11
InP Another embodiment of the RHBT is described with reference to FIGS. 17 and 18. FIG. 17 is a sectional view of another semifinished RHBT, and corresponds to FIG. 5. Compared with the RHBT in FIG. 5, in the RHBT in FIG. 17 the barrier layer 15B is removed from the RHBT in FIG. 5. Other elements are substantially equal to those in FIG. 5. FIG. 18 is a graph illustrating an energy state of the RHBT in FIG. 17 and corresponds to FIGS. 7 and 8.

The modifications and the principle set forth above can be applied to the RHBT in FIG. 17.

In the above description, the RHBT 111 has only one sub-band energy level $E_x$. Nevertheless, the RHBT 111 may have a plurality of sub-band energy levels, and in this case, a characteristic curve may have a plurality of resonant-point peaks and a plurality of valleys. A plurality of memory cell states can be realized by using a RHBT, and accordingly, a multi-level memory cell can be realized. In addition, the RHBT 111 may have a plurality of quantum well.

In the above embodiments, the superlattice structure including the quantum well and functioning as a resonant carrier injector to the base can be formed between the emitter layer and the base layer, as set forth above, or in the emitter layer.

In addition, a resonant-tunneling heterojunction transistor device having a p-n-p structure can be achieved instead of the above n-p-n RHBT device.

Many widely different embodiments of the present invention may be constructed without departing from the spirit and scope of the present invention. It should be understood that the present invention is not limited to the specific embodiments described in this specification, except as defined in the appended claims.

We claim:

1. A resonant-tunneling heterojunction transistor device comprising:
    an emitter layer;
    a collector layer;
    a base layer located between the said emitter and collector layers; and
    a superlattice structure located in said emitter layer for providing at least one quantum well in which there is a resonant-state energy level (Ex);
    said base layer formed of a semiconductor material having a first conductivity type and said emitter layer formed of a semiconductor material having a second conductivity type opposite said first conductivity type,
    the lowest energy level (Ec) of a conduction band of at least one side of said superlattice structure being one of a level higher than, equal to, and lower than said resonant-state energy level (Ex), depending upon a magnitude of a bias voltage applied between said emitter and base layers,
    said collector layer formed of semiconductor material of the second conductivity type, and said base layer and said collector layer having a common interface forming a PN junction therebetween.

* * * * *